United States Patent [19]
Song

[11] Patent Number: 6,049,573
[45] Date of Patent: *Apr. 11, 2000

[54] EFFICIENT POLYPHASE QUADRATURE DIGITAL TUNER

[75] Inventor: William S. Song, Lexington, Mass.

[73] Assignee: Massachusetts Institute of Technology, Cambridge, Mass.

[*] Notice: This patent is subject to a terminal disclaimer.

[21] Appl. No.: 08/989,219

[22] Filed: Dec. 11, 1997

[51] Int. Cl.[7] .............................. H03K 9/00; H03H 7/30; H03D 1/00
[52] U.S. Cl. .......................... 375/316; 375/235; 375/340
[58] Field of Search .................................. 375/316, 235, 375/340, 350, 261, 349; 348/398; 329/304, 306, 345, 346

[56] References Cited

U.S. PATENT DOCUMENTS

| | | | |
|---|---|---|---|
| 3,717,816 | 2/1973 | Langer | 455/133 |
| 4,691,176 | 9/1987 | Hsiung et al. | 331/2 |
| 4,779,054 | 10/1988 | Monteleone et al. | 329/323 |
| 4,821,294 | 4/1989 | Thomas, Jr. | 375/343 |
| 4,888,557 | 12/1989 | Puckette, IV et al. | 329/341 |
| 4,902,979 | 2/1990 | Puckette, IV | 329/343 |
| 4,910,467 | 3/1990 | Leitch | 329/306 |
| 4,922,506 | 5/1990 | McCallister et al. | 375/207 |
| 4,975,927 | 12/1990 | Yoshida et al. | 375/235 |
| 5,081,521 | 1/1992 | Faroudja | 348/491 |
| 5,111,202 | 5/1992 | Rivera et al. | 341/139 |
| 5,200,978 | 4/1993 | Lo Curto et al. | 375/286 |
| 5,298,908 | 3/1994 | Piele | 342/363 |
| 5,640,416 | 6/1997 | Chalmers | 375/206 |
| 5,841,811 | 11/1998 | Song | 375/235 |

FOREIGN PATENT DOCUMENTS

| | | |
|---|---|---|
| 0445335 A1 | 9/1991 | European Pat. Off. . |
| 0810729 | 3/1997 | European Pat. Off. . |

OTHER PUBLICATIONS

Bellanger et al., "Digital Filtering by Polyphase Network: Application to Sample–Rate Alteration and Filter Banks", *IEEE Transactions on Acoustics, Speech and Signal Processing*, vol. ASSP–24, No. 2, Apr. 1976, pp. 109–114.

Brown, Jr., J.L., "On Quadrature Sampling of Bandpass Signals", *IEEE Transactions on Aerospace and Electronic Systems*, vol. AES–15, No. 3, May 1979, pp. 366–371.

Considine, V., "Digital Complex Sampling", *Electronics Letters*, Aug. 4, 1983, vol. 19, No. 16, pp. 608–609.

Grace et al., "Quadrature Sampling of High–Frequency Waveforms", *The Journal of the Acoustical Society of America*, vol. 44, No. 5, 1968, pp. 1453–1454.

(List continued on next page.)

*Primary Examiner*—Chi H. Pham
*Assistant Examiner*—Khai Tran
*Attorney, Agent, or Firm*—Samuels, Gauthier & Stevens, LLP

[57] ABSTRACT

A polyphase quadrature digital tuner system which converts input signals to baseband inphase and quadrature signal components. The system includes a signal receiver which receives the input signals having a frequency centered around a predetermined carrier frequency. A signal processor continuously samples the input signals and multiplies selected portions of the input signals by a value of 1 or –1 to produce discrete sequences of N input samples, where N is an integer. An inphase signal channel includes a first set of N filters in a first filter stage each having respective filter coefficients, the first set of filters arranged to receive the discrete sequences, and a first signal summer which sums the outputs of the first set of N filters to produce the inphase signal component. A quadrature signal channel includes a second set of N filters in the first filter stage each having respective filter coefficients, the second set of filters arranged to receive the discrete sequences, and a second signal summer which sums the outputs of the second set of N filters to produce the quadrature signal component. The input samples are provided to the inphase and quadrature signal channels so that each filter of both channels receives one input sample of each sequence.

26 Claims, 4 Drawing Sheets

OTHER PUBLICATIONS

Horiguchi, Toshio, "A Full Digital Phase Delay Compensation Beam–Forming Scheme for Ultrasonic Imaging Using Arrays", *NEC Res. & Develop.*, No. 88, Jan. 1988, pp. 47–56.

Liu et al., "A New Quadrature Sampling and Processing Approach", *IEEE Transactions on Aerospace and Electronic Systems,* vol. 25, No. 5, Sep. 1989, pp. 733–748.

Lu, Chung H., "Polyphase FIR Filters for the Demodulation of Chrominance Signals", *IEEE ISCAS,* 1988, pp. 2313–2316.

Marino, José B. and Enrique Masgrau, "Sampling In–Phase and Quadrature Components of Band–Pass Signals", *Signal Processing,* vol. 20, No. 2, Jun. 1990, pp. 121–125 & cover page.

Pellon, Leopold E., "A Double Nyquist Digital Product Detector for Quadrature Sampling", *IEEE Transactions on Signal Processing,* vol. 40, No. 7, Jul. 1992, pp. 1670–1681.

Radar, Charles M., "A Simple Method for Sampling In–Phase and Quadrature Components", *IEEE Transactions on Aerospace and Electronic Systems,* vol. AES–20, No. 6, Nov. 1984, pp. 821–824.

Rice et al., "Quadrature Sampling With High Dynamic Range", *IEEE Transactions on Aerospace and Electronic Systems,* vol. AES–18, No. 4, Nov. 1982, pp. 736–739.

Sadr et al., "Digital Carrier Demodulation for the DSN Advanced Receiver", *TDA Progress Report,* Jet Propulsion Lab. & NASA Case No. NPO–17628, Jan.–Mar. 1988, pp. 1a–16a, pp. i–ii, & table of contents pp. 1–2.

Saulnier, et al., "A VLSI Demodulator for Digital RF Network Applications: Theory and Results", *IEEE Journal on Selected Areas in Communications,* vol. 8, No. 8,Oct. 1990, pp. 1500–1511.

Teitelbaum, Kenneth, "A Flexible Processor for a Digital Adaptive Array Radar", *Proceedings of the 1991 IEEE National Radar Conference,* Los Angeles, CA, Mar. 12–13, 1991, pp. 103–107 & "Briefing on Group 49 Processor", cover & p. 2.

Thomas, et al. "Sampling Downconverter for Radio–Frequency Signals", *NASA Jet Propulsion Laboratory Progress Report,* JPL & NASA Case No. NPO–17530, pp. i. 1. 1a–16a.

Waters et al., "Bandpass Signal Sampling and Coherent Detection", *IEEE Transaction on Aerospace and Electronic Systems,* vol. AES–18, No. 4, Nov. 1982, pp. 731–736.

Webb, Richard C., "If Signal Sampling Improves Receiver Detection Accuracy", *Microwaves & RF,* Mar. 1989, pp. 99–103.

Petrowski et al, "Single Chip Digital Down Converter Architecture", 1993 IEEE International Conference on Acoustics, Speech, and Signal Processing, vol. I of V, pp. 349–352, Apr. 1993.

Olmstead et al; "Single Chip Digital Down Converter in Communications Applications", Proceding of the Forth International Conference on Signal Processing Applications & Technology, vol. 1, pp. 636–640, Sep. 28–Oct. 1, 1993.

Gray, et al. "The AST All–Digital Tuner Chip Set", Conference Record, Twenty–Second Asilomar Conference on Signals, Systems & Computers, vol. 1 of 2, pp. 199–203, Oct. 31–Nov. 2, 1988.

Chester et al., "Single Chip Digital Down Converter Simplifiers RF DSP Applica;tions", RF Design, vol. 15, No. 12, pp. 39–46, Nov., 1992.

"Dual Channel Decimation Receiver" Analog Devices (Product under development), pp. 1–28, Jun. 11, 1997.

Zhang et al., "A novel approach to the design of I/Q demodulation filters", IEEE Pac Rim '93, vol. 1, May 19, 1993, pp. 72–76.

Min et al., Equivalent structures of a periodically time varying digital filter, IEICE, vol. E73, No. 6, Jun., 1990, pp. 893–899.

EFFICIENT POLYPHASE QUADRATURE DIGITAL TUNER

SPONSORSHIP INFORMATION

This invention was made with government support under Contract No. F19628-95-C-0002 awarded by the U.S. Air Force. The government has certain rights in the invention.

BACKGROUND OF THE INVENTION

The invention relates to polyphase quadrature digital tuners.

In many coherent sonar, radar and communication applications, it is useful for the receiver outputs to be converted to baseband inphase quadrature (denoted I and Q) signal components. This process is referred to as quadrature sampling. When the application uses digital signal processing (DSP), the I and Q signals are converted to digital signals by analog-to-digital (A/D) converters.

SUMMARY OF THE INVENTION

It is an object of the invention to provide an efficient polyphase quadrature digital tuner that does not require direct digital synthesis. The elimination of direct digital synthesis greatly simplifies the design and implementation of the digital tuner. Although, the proposed digital tuner does not have continuous tuning frequencies unless the sampling rate is varied, it achieves full frequency coverage with uniformly spaced center frequencies, which is adequate for many applications.

It is also an object of the invention to provide a digital tuner which can be used for just about any commercial and military application that require RF receivers. These application areas include communications, cellular phones, cellular base stations, mobile communications, satellite communications, radar, and electronics warfare. In addition to RF receivers, the invention may be used for sonar receivers.

Accordingly, the invention provides a polyphase quadrature digital tuner system which converts input signals to baseband inphase and quadrature signal components. The system includes a signal receiver which receives the input signals having a frequency centered around a predetermined carrier frequency. A signal processor continuously samples the input signals and multiplies selected portions of the input signals by a value of 1 or −1 to produce discrete sequences of N input samples, where N is an integer. An inphase signal channel includes a first set of N filters in a first filter stage each having respective filter coefficients, the first set of filters arranged to receive the discrete sequences, and a first signal summer which sums the outputs of the first set of N filters to produce the inphase signal component. A quadrature signal channel includes a second set of N filters in the first filter stage each having respective filter coefficients, the second set of filters arranged to receive the discrete sequences, and a second signal summer which sums the outputs of the second set of N filters to produce the quadrature signal component. The input samples are provided to the inphase and quadrature signal channels so that each filter of both channels receives one input sample of each sequence.

DETAILED DESCRIPTION OF THE ILLUSTRATED EMBODIMENTS

Figure 1:
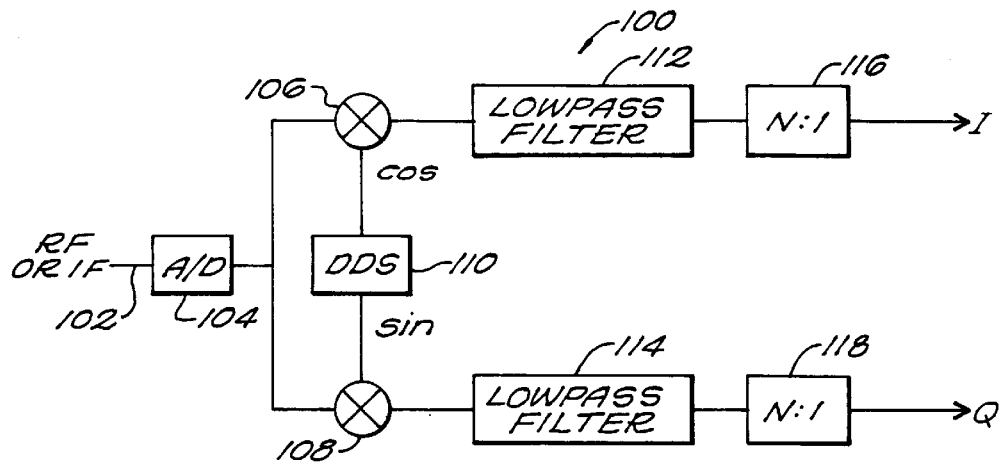
FIG. 1 is a schematic diagram of a conventional digital tuner.

FIG. 1 is a schematic diagram of a conventional digital tuner 100. A radio frequency (RF) or intermediate frequency (IF) input 102 is sampled by an analog-to-digital (A/D) converter 104 and is mixed down to baseband by digital mixers 106 and 108 using the outputs of a direct digital synthesis (DDS) module 110. The DDS generates cosine (COS) and sine (SIN) waves to mix the signal down to baseband in-phase (I) and quadrature (Q) signals. The output of the mixers are then filtered via low pass filters 112 and 114, and decimated by a factor of N via decimation modules 116 and 118 in order to reduce the output sampling rate.

Figure 2:
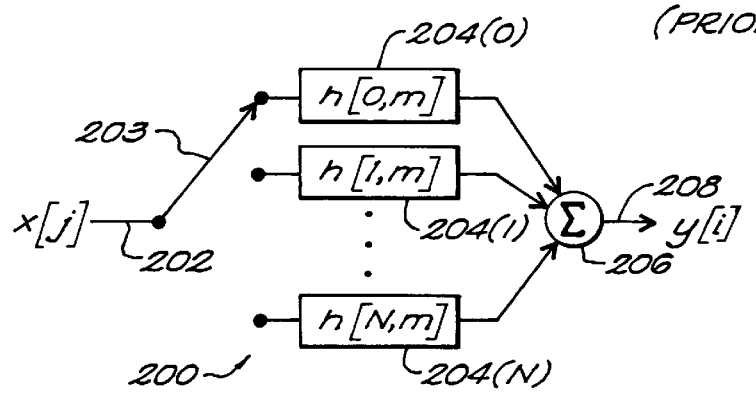
FIG. 2 is a schematic diagram of a conventional FIR filter and a N:1 decimation module implemented in a polyphase FIR filter.

When the lowpass filters are finite response (FIR) filters, then polyphase techniques can be used for filtering and decimation in order to reduce the signal processing operations count. FIG. 2 is a schematic diagram of an FIR filter and a N:1 decimation module implemented in a polyphase FIR filter 200. Assume the coefficients of the original K-tap FIR filters to be H[k], where k=0,1,2, . . . , K−1. Let the input 202 to the original filter be x[j], where j=0,1,2, . . . , J−1. In the polyphase implementations, the original K-tap filter is divided into N of K/N tap subfilters 104(0)–104(N). Accordingly, with reference to the n-th subfilter H[n,m]=H[mN+n], where n=0,1,2, . . . , N−1, and m=0,1,2, . . . , (K/N)−1. On the input side, x[iN+n] is sent to the n-th subfilter, where i=0,1,2, . . . (J/N)−1, via controlled switch 203. The subfilter outputs, which resulted from the inputs x[iN+n] with the same i, are summed at a summation module 206 to produce the polyphase filter output y[i] 208.

The polyphase filter performs identical operations as the original H[k] followed by N:1 decimation. However, the polyphase filter requires approximately N times less numerical operations as the original filter and decimation because the polyphase does not compute the output data that is thrown away in the decimation stage.

Figure 3:
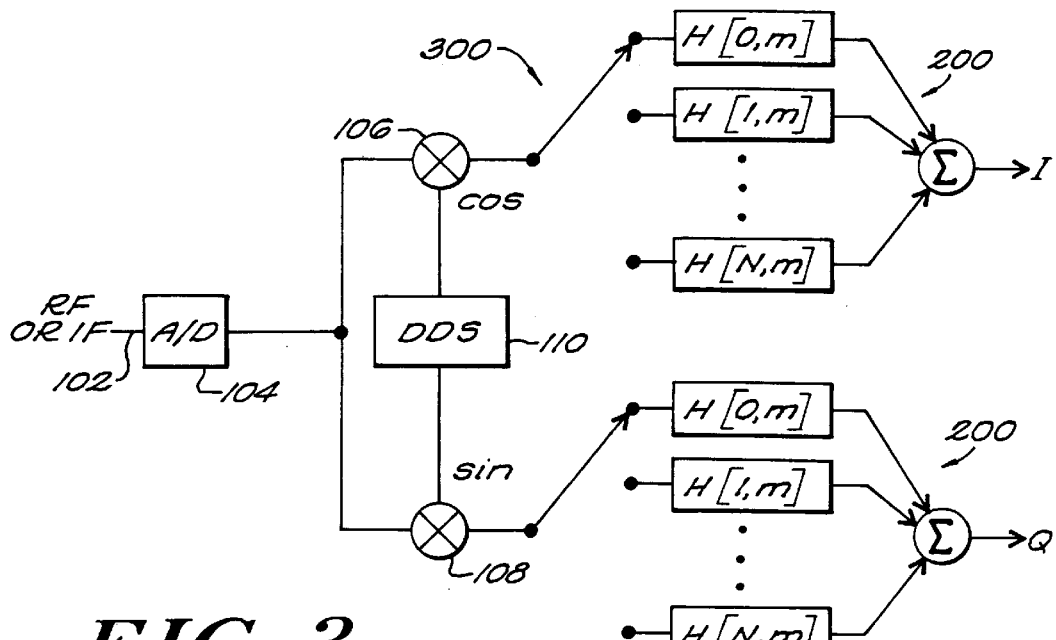
FIG. 3 is a schematic diagram of a digital tuner made more efficient by replacing the lowpass filter and N:1 decimation stages of the tuner of FIG. 1 with the polyphase FIR filter of FIG. 2.

FIG. 3 is a schematic diagram of a digital tuner 300 made more efficient by replacing the lowpass filter and N:1 decimation stages of the tuner 100 of FIG. 1 with the polyphase FIR filter 200 of FIG. 2. However, when digital tuning frequency $f_t$ is limited to $f_t=1\cdot f_s/N$, where $f_s$ is the A/D converter sampling frequency and l=0,1,2, . . . , (N/2)−1, then the DDS and digital mixer can be eliminated as shown in FIG. 4.

Figure 4:
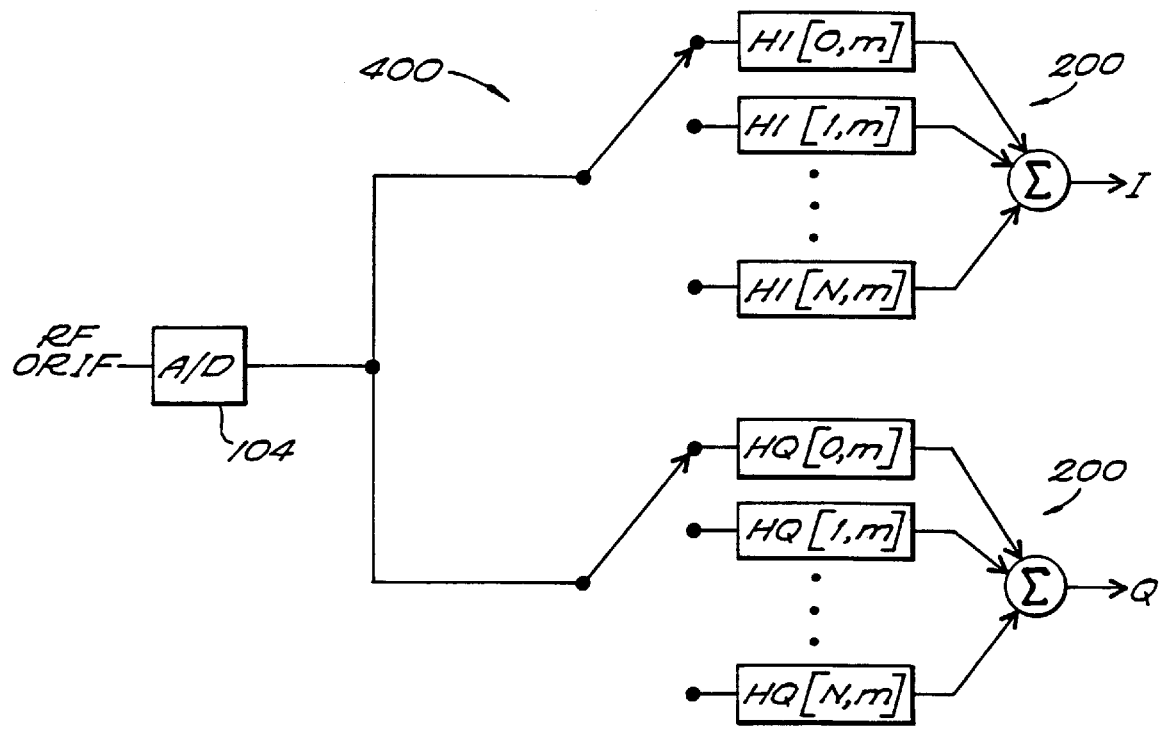
FIG. 4 is a schematic diagram of a polyphase digital tuner in which the DDS and mixers are removed from the tuner of FIG. 3 in accordance with the invention.

FIG. 4 is a schematic diagram of a polyphase digital tuner 400 in which the DDS 110 and mixers 106, 108 are removed from the tuner 300 of FIG. 3. In this case, the in-phase subfilters should be, $H_I[n,m]=\cos((1\cdot 2\pi/N)n+p)\cdot H[n,m]$, and quadrature channel subfilters should be, $H_Q[n,m]=\sin((l\cdot 2\pi/N)n+p)\cdot H[n,m]$, where p is the phase offset. The configuration of FIG. 4 is mathematically equivalent to that of FIG. 3 for these limited tuning frequencies. Since generating cosine and sine waves with large spur free dynamic range requires significant hardware, the configuration of FIG. 4 can be very efficient in hardware implementation.

Figure 5:
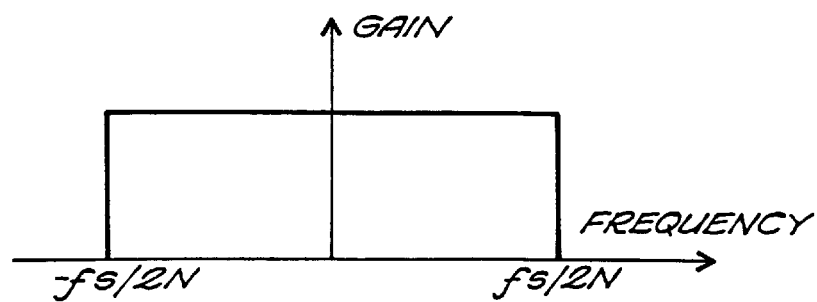
FIG. 5 is a graph showing the polyphase filter response required for continuous frequency coverage without aliasing.

It will be appreciated that there are some limitations to the technique shown in FIG. 4. It is impossible for the digital tuner 400 to have continuous frequency coverage without signals outside the turning frequency band aliasing in-band. Since the tuning frequency is spaced $f_s/N$, apart, the width of the filter passband also has to be $f_s/N$ in order to have full frequency coverage. However, the maximum bandwidth of the filter output is also $f_s/N$, which is equal to the output sampling rate. Accordingly, the filter has to reject all signals outside the passband in order to avoid the outside signals from aliasing in-band. This leaves no room for filter transition band and the filter has to be infinitely sharp as shown in the graph of FIG. 5. FIG. 5 is a graph showing the polyphase filter response required for continuous frequency coverage without aliasing.

There are some cases when continuous frequency coverage is not required. For example, communications frequency may be uniformly spaced, but the bandwidth may be somewhat less than the frequency spacing in order to introduce a "guard band" which keep the signals at different frequency bin from interfering with each other. In this case, the width of the filter's transition band may be equal to the width of the guard band. However, this transition band usually tends to be narrow in order to maximize the utilization of the frequency allocation. Therefore, the filter may require many taps in order to meet the transition band requirements.

Figure 6:
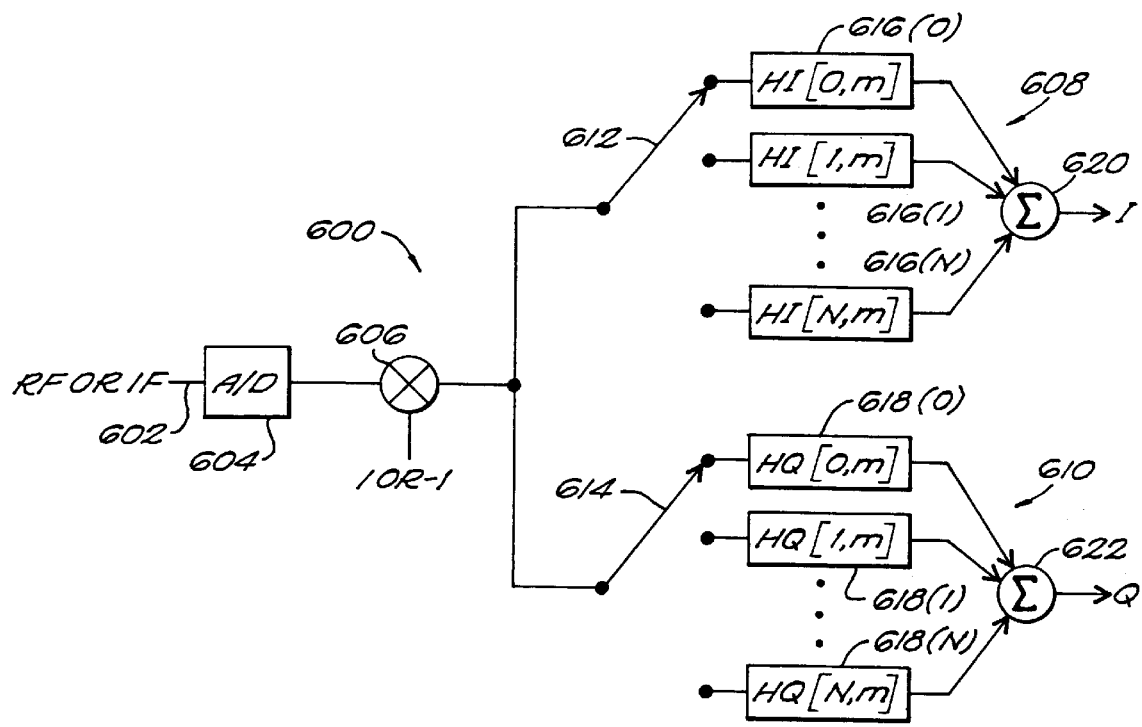
FIG. 6 is a schematic diagram of a polyphase quadrature digital tuner in accordance with the invention.

The aforementioned problems with the digital tuner 400 can be resolved with the innovative shown in FIG. 6. FIG. 6 is a schematic diagram of a polyphase quadrature digital tuner 600 in accordance with the invention. A radio frequency (RF) or intermediate frequency (IF) input 602 is sampled by an analog-to-digital (A/D) converter 604 and is provided to a multiplier 606 which alternately multiplies the sampled input by 1 or −1. The signals are then provided to polyphase FIR filters 608 and 610 via controlled switches 612 and 614. Each of the polyphase FIR filters include FIR filters 616(0)–616(N) and 618(0)–618(N), respectively. The outputs of the FIR filters are summed by summation modules 620 and 622 to respectively output the I and Q signals.

In this case, the filter coefficients are $H_I[m, n]=\cos((l\cdot\pi/N)n+p)\cdot H[n,m]$, and $H_Q[m,n]=\sin((l\cdot\pi/N)n+p)\cdot H[n,m]$, where l=0,1,2, . . . , N−1. The input x[n] is multiplied by −1 every other N samples when l is odd. Accordingly, the new toggled input $x_t$ is $x_t[iN+n]=(-1)^i x[iN+n]$. An input equal to $x_t[iN+n]=(-1)^{i+1}x[iN+n]$ works just as well. FIG. 6 is equivalent to FIG. 3 for these tuning frequencies and the tuning frequency spacing is reduced to $f_s/2N$. The available tuning frequencies are $f_t=l\cdot f_s/2N$, where l=0,1,2, . . . , N−1. The configuration of tuner 600 is mathematically equivalent to that of tuner 300 for these tuning frequencies.

Figure 7:
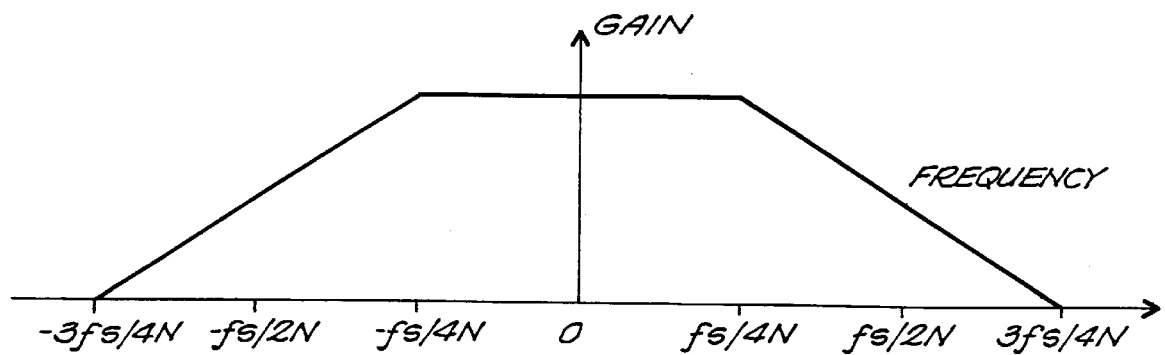
FIG. 7 is a graph showing the polyphase filter response required for a passband width of $f_s/2N$.

With the architecture of tuner 600 shown in FIG. 6, it is possible to get full frequency coverage without aliasing. While the complex output sampling rate is still at $f_s/N$, the tuning frequency spacing is at $f_s/2N$. Thus, the filter's passband width can be made $f_s/2N$ wide and can get the full coverage as shown in the graph of FIG. 7. FIG. 7 is a graph showing the polyphase filter response required for a passband width of $f_s/2N$. There is plenty of room for the transition band, which enables the filter to attentuate the signals that alias to baseband.

It is possible to make the passband wider or narrower than $f_s/2N$ depending on the applications requirement. When the passband is narrower than $f_s/2N$, it is possible to add another lowpass polyphase filter as shown in the configuration of FIG. 8.

Figure 8:
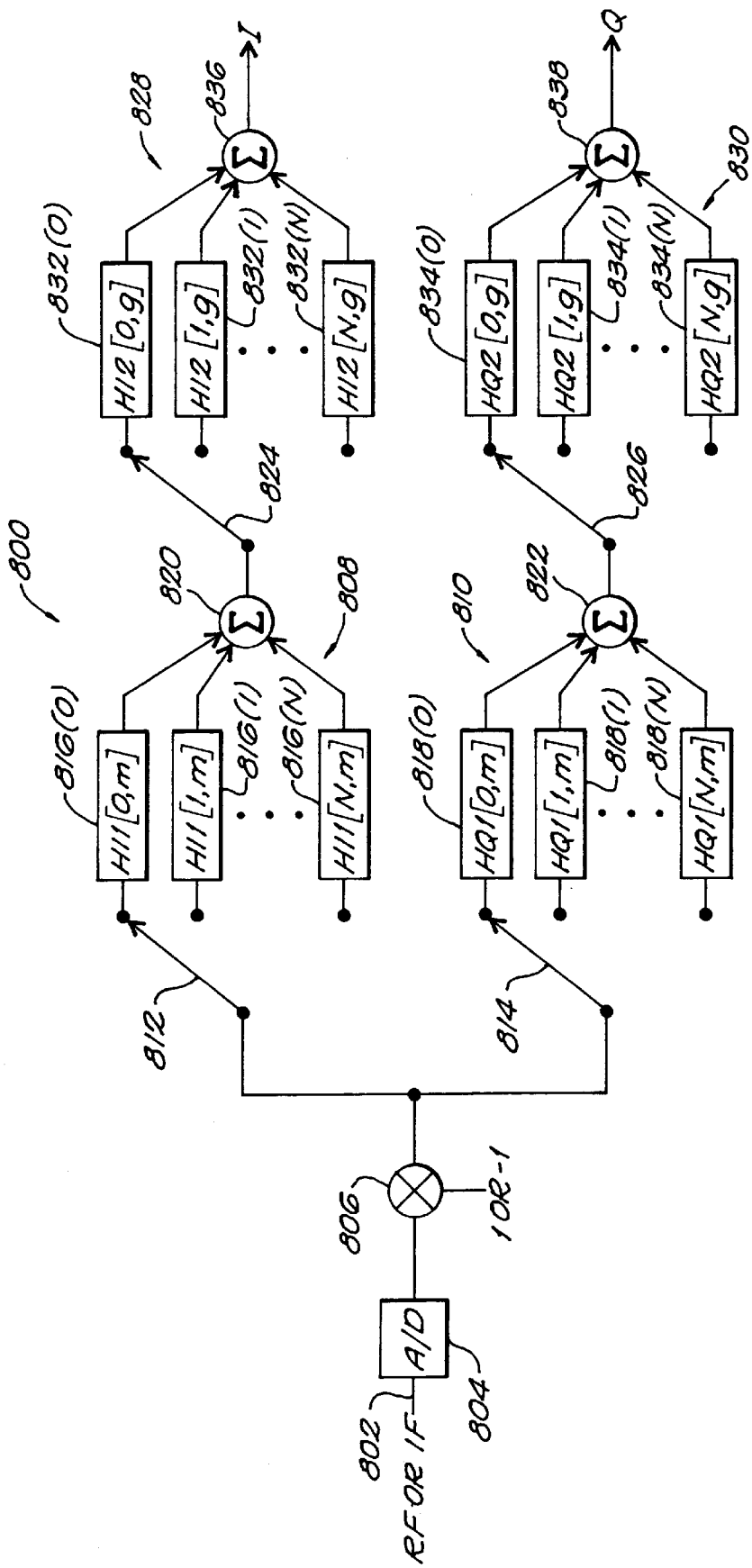
FIG. 8 is a schematic diagram of a multistage polyphase quadrature digital tuner in accordance with the invention.

FIG. 8 is a schematic diagram of a multistage polyphase quadrature digital tuner 800. A radio frequency (RF) or intermediate frequency (IF) input 802 is sampled by an analog-to-digital (A/D) converter 804 and is provided to a multiplier 806 which alternately multiplies the sampled input by 1 or −1. The signals are then provided to a first stage having polyphase FIR filters 808 and 810 via controlled switches 812 and 814. Each of the polyphase FIR filters include FIR filters 816(0)–816(N) and 818(0)–818(N), respectively. The outputs of the first stage FIR filters are summed by summation modules 820 and 822 and provided to a second stage of polyphase FIR filters via controlled switches 824 and 826, respectively. The second stage includes polyphase FIR filters 828 and 830. Each of the polyphase FIR filters include FIR filters 832(0)–832(N) and 834(0)–834(N), respectively. The outputs of the FIR filters are summed by summation modules 836 and 838 to respectively output the I and Q signals. It will be appreciated by those of skill in the art that further filter stages can be utilized.

The advantage of the second or subsequent polyphase filter stages is that the output sampling rate can be further reduced. Lower output sampling rates can reduce the computational requirements of the subsequent signal processing tasks. In FIG. 8, a 2:1 decimation polyphase filter is used to result in the final sampling rate of $f_s/2N$. Another advantage of using multiple stage polyphase filtering is the reduced computational requirement. It takes significantly fewer taps to provide a sharp transition band in the second stage polyphase filter than in the first stage because the transition bandwidth is not as small compared to the input sampling rate.

There are techniques other than flipping the sign of every other sampled input to the subfilter to achieve mathematically equivalent results for the architectures shown in FIGS. 6 and 8. For example, the sign of the coefficients of the subfilters can be flipped every other time a new input goes into a subfilter. Another technique involves flipping the sign of the product of the input and coefficient of the each tap of the filter every other time a new input is provides to a subfilter. Furthermore, another technique involves the partial product outputs of each subfilter can be alternately multiplied by 1 or −1.

There are other architectures which can implement the signal processing as the configurations of FIGS. 6 and 8. For example, banks of subfilters can be implemented with a partial product engine which computes the sum of products. For lower sample rate systems, it is also possible to implement these algorithms in software. In addition, if quadrature signal processing is not required by the application, it is possible to use only the inphase or quadrature channel.

Although the invention has been developed using FIR filters as subfilters, it is possible to generalize the architecture for infinite impulse response (IIR) filters as well as the combination of FIR and IIR using known polyphase architectures.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A polyphase quadrature digital tuner system which converts input signals to baseband inphase and quadrature signal components, said system comprising:

a signal receiver which receives said input signals having a frequency centered around a predetermined carrier frequency;

a signal processor which continuously samples said input signals and multiplies selected portions of said input signals by a value of 1 or −1 to produce discrete sequences of N input samples, where N is an integer;

an inphase signal channel including a first set of N filters in a first filter stage each having respective filter coefficients, said first set of filters arranged to receive said discrete sequences, and a first signal summer which sums the outputs of said first set of N filters to produce said inphase signal component;

a quadrature signal channel including a second set of N filters in said first filter stage each having respective filter coefficients, said second set of filters arranged to receive said discrete sequences, and a second signal summer which sums the outputs of said second set of N filters to produce said quadrature signal component; and means for providing said input samples to said inphase and quadrature signal channels so that each filter of both channels receives one input sample of each sequence.

2. The system of claim 1, wherein said signal processor comprises an analog-to-digital converter which generates digital input samples.

3. The system of claim 1, wherein said signal processor continuously samples said input signal at a sampling frequency of 2N/L of said carrier frequency, where L is an integer.

4. The system of claim 1, wherein each of said filters comprise M taps, where M is an integer.

5. The system of claim 1, wherein said providing means operates to simultaneously switch said input samples of each sequence between each filter in said inphase and quadrature signal channels.

6. The system of claim 1 further comprising at least a second filter stage having at least one filter in each channel which performs filtering and decimation of the outputs of said first and second signal summers.

7. The system of claim 6 further comprising a plurality of successive filter stages each providing at least one filter in each channel which performs filtering and decimation of the outputs of previous filter stages.

8. The system of claim 1 further comprising:

a third set of P filters in a second filter stage of said inphase signal channel, said third set of P filters arranged to receive said discrete sequences from said first signal summer, and a third signal summer which sums the outputs of said third set of P filters to produce said inphase signal component;

a fourth set of P filters in said second filter stage of said quadrature signal channel, said fourth set of P filters arranged to receive said discrete sequences from said second signal summer, and a fourth signal summer which sums the outputs of said fourth set of P filters to produce said quadrature signal component; and means for providing said discrete sequences from said first and second signal summers to said third and fourth set of P filters so that each filter of both channels receives one input sample of each sequence.

9. The system of claim 8 further comprising a plurality of successive filter stages each providing sets of R filters in each channel which performs filtering and decimation of the outputs previous filter stages.

10. The system of claim 1, wherein said signal processor continuously samples said input signals and alternately multiplies selected portions of said input signals by a value of 1 and −1 to produce discrete sequences of N input samples.

11. The system of claim 1, wherein the coefficients of each filter in each filter stage is multiplied by a value of 1 or −1 for each new sample provided to the filters.

12. The system of claim 1, wherein the partial products of coefficients and input values are multiplied by a value of 1 or −1 prior to further filter processing.

13. The system of claim 1, wherein said filters comprise FIR filters.

14. The system of claim 1, wherein said filters comprise IIR filters.

15. A method of polyphase quadrature tuning by converting input signals to baseband inphase and quadrature signal components, said method comprising:

receiving said input signal having a frequency centered around a predetermined carrier frequency;

continuously sampling said input signals;

multiplying selected portions of said input signals by a value of 1 or −1 to produce discrete sequences of N input samples, where N is an integer;

applying said discrete sequences to an inphase signal channel including a first set of N filters each having respective filter coefficients, said first set of filters arranged to receive said discrete sequences:

summing the outputs of said first set of N filters to produce said inphase signal component;

applying said discrete sequences to a quadrature signal channel including a second set of N filters each having respective filter coefficients, said second set of filters arranged to receive said discrete sequences;

summing the outputs of said second set of N filters to produce said quadrature signal component; and simultaneously providing said input samples of each sequence between each filter of said inphase and quadrature signal channels so that each filter receives one input sample of each sequence.

16. The method of claim 15 further comprising generating digital input samples.

17. The method of claim 15 further comprising continuously samples said input signal at a sampling frequency of 2N/L of said carrier frequency, where L is an integer.

18. The method of claim 15 further comprising simultaneously switch said input samples of each sequence between each filter in said inphase and quadrature signal channels.

19. The method of claim 15 further comprising filtering and decimation of the outputs of said first and second signal summers with at least a second filter stage having at least one filter in each channel.

20. The method of claim 19 further comprising filtering and decimation of the outputs of previous filter stages with a plurality of successive filter stages each providing at least one filter in each channel.

21. The method of claim 15 further comprising:

receiving said discrete sequences from said first signal summer with a third set of P filters in a second filter stage of said inphase signal channel, and summing the outputs of said third set of P filters to produce said inphase signal component;

receiving said discrete sequences from said second signal summer with a fourth set of P filters in said second filter stage of said quadrature signal channel, and summing the outputs of said fourth set of P filters to produce said quadrature signal component; and providing the summed discrete sequences to said third and fourth set of P filters so that each filter of both channels receives one input sample of each sequence.

22. The method of claim 21 further comprising filtering and decimation of the outputs previous filter stages with a plurality of successive filter stages each providing sets of R filters in each channel.

23. The method of claim 15 further comprising continuously samples said input signals and alternately multiplying selected portions of said input signals by a value of 1 and −1 to produce discrete sequences of N input samples.

24. The method of claim 15, wherein the coefficients of each filter in each filter stage is alternately multiplied by a value of 1 and −1 for each new sample provided to the filters.

25. The method of claim 15, wherein the partial products of coefficients and input values are multiplied by a value of 1 or −1 prior to further filter processing.

26. A method of polyphase quadrature tuning by converting input signals to baseband inphase and quadrature signal components, said method comprising:

receiving said input signal having a frequency centered around a predetermined carrier frequency;

continuously sampling said input signals;

multiplying selected portions of said input signals by a value of 1 or −1 to produce discrete sequences of N input samples, where N is an integer;

applying said discrete sequences to an inphase filtering sequence including a first set of N filters each having respective filter coefficients, said first set of filters arranged to receive said discrete sequences:

summing the outputs of said first set of N filters to produce said inphase signal component;

applying said discrete sequences to a quadrature filtering sequence including a second set of N filters each having respective filter coefficients, said second set of filters arranged to receive said discrete sequences;

summing the outputs of said second set of N filters to produce said quadrature signal component; and simultaneously providing said input samples of each sequence between each filter of said inphase and quadrature filtering sequence so that each filter receives one input sample of each sequence.

* * * * *